US009614067B2

(12) United States Patent
Kim et al.

(10) Patent No.: US 9,614,067 B2
(45) Date of Patent: Apr. 4, 2017

(54) SEMICONDUCTOR DEVICE AND METHOD OF FABRICATING SAME

(71) Applicant: KOREA UNIVERSITY RESEARCH AND BUSINESS FOUNDATION, Seoul (KR)

(72) Inventors: Sang Sig Kim, Seoul (KR); Young In Jeon, Hanam-si (KR); Min Suk Kim, Bucheon-si (KR); Doo Hyuk Lim, Seoul (KR); Yoonjoong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/604,127

(22) Filed: Jan. 23, 2015

(65) Prior Publication Data

US 2016/0043207 A1    Feb. 11, 2016

(30) Foreign Application Priority Data

Aug. 11, 2014    (KR) .................. 10-2014-0103160

(51) Int. Cl.
| H01L 29/775 | (2006.01) |
| H01L 29/66 | (2006.01) |
| H01L 21/02 | (2006.01) |
| B82Y 10/00 | (2011.01) |
| B82Y 40/00 | (2011.01) |
| H01L 29/423 | (2006.01) |
| H01L 29/06 | (2006.01) |

(52) U.S. Cl.
CPC ............ *H01L 29/775* (2013.01); *B82Y 10/00* (2013.01); *B82Y 40/00* (2013.01);
(Continued)

(58) Field of Classification Search
CPC .... H01L 2924/13061; H01L 29/0669–29/068; H01L 21/02601; Y10S 977/938; Y10S 977/773–977/777
(Continued)

(56) References Cited

U.S. PATENT DOCUMENTS

| 8,853,824 B1 * | 10/2014 | Wang .................. H01L 29/78 257/547 |
| 2007/0014151 A1 * | 1/2007 | Zhang .................. B82Y 10/00 257/E21.209 |

(Continued)

OTHER PUBLICATIONS

Youngin Jeon, Switching characteristics of nanowire feedback field-effect transistors with nanocrystal charge spacers on plastic substrates, Jan. 24, 2014.*

(Continued)

*Primary Examiner* — Marc Armand
*Assistant Examiner* — Quinton Brasfield
(74) *Attorney, Agent, or Firm* — Kile Park Reed & Houtteman PLLC

(57) ABSTRACT

A semiconductor device comprising: an insulation substrate; an intrinsic semiconductor nanowire formed on the insulation substrate and having both ends doped in a p-type and an n-type, respectively and a region, which is not doped, between the doped region; doped region electrodes formed on each of the p-type doped region and the n-type doped region of the semiconductor nanowire; a lower insulation layer formed on an intrinsic region of the semiconductor nanowire; an intrinsic region electrode formed on a part of the lower insulation layer; and a metal or semiconductor nanoparticle region formed on the lower insulation layer and between the intrinsic region electrode and the doped region electrode and spaced apart from the electrodes.

12 Claims, 11 Drawing Sheets

(52) U.S. Cl.
CPC .... *H01L 21/02601* (2013.01); *H01L 29/0673* (2013.01); *H01L 29/42364* (2013.01); *H01L 29/66439* (2013.01); *H01L 2924/13061* (2013.01)

(58) Field of Classification Search
USPC .................................................. 257/16, 29
See application file for complete search history.

(56) References Cited

U.S. PATENT DOCUMENTS

| | | | |
|---|---|---|---|
| 2010/0276667 A1* | 11/2010 | Kim | B82Y 10/00 257/24 |
| 2011/0204323 A1* | 8/2011 | Espiau de Lamaestre | H01L 33/0041 257/13 |
| 2013/0134392 A1* | 5/2013 | Afzali-Ardakani | H01L 29/778 257/29 |
| 2013/0137236 A1* | 5/2013 | Bhuwalka | H01L 29/66356 438/305 |

OTHER PUBLICATIONS

Youngin Jeon et al., "Switching Characteristics of Nanowire Feedback Field-Effect Transistors with Nanocrystal Charge Spacers on Plastic Substrates", ACSNANO, vol. 8, No. 4. pp. 3781-3787, 2014.

* cited by examiner

SEMICONDUCTOR DEVICE AND METHOD OF FABRICATING SAME

FIELD OF THE INVENTION

The present invention relates to a semiconductor device and a method of fabricating the same, and more particularly, to an energy efficient semiconductor device fabricated by a nanowire and a method of fabrication the same.

DESCRIPTION OF THE RELATED ART

Recently, various forms of portable/wearable device concepts are being announced in accordance with downsizing and multi-functionalizing of electronic devices, and research related to energy efficient soft devices are required to realize this. However, various limitations exist for realizing various forms of energy efficient soft devices with typical bulk silicon based device technologies.

Specifically, when fabricating a typical bulk Si type Metal Oxide Silicon Field Effect Transistor (MOSFET), a degree of integration of a device increases as a channel length of the MOSFET becomes shorter. However, as a size of the device becomes smaller, the channel length of the transistor formed on a device forming region, specifically on an active region, becomes shorter, and accordingly, effects of source/drain regions has on a field of a channel region becomes significant and a short channel effect, in which a channel driving ability by a gate electrode degrades, occurs.

The short channel effect in the MOSFET generates a subthreshold leakage current, and the leakage current increases standby power and power consumption of the transistor.

To solve the problems of the bulk Si type MOSFET described above, technologies to reduce the subthreshold leakage current by reducing a subthreshold swing of the MOSFET are being researched. But, from a carrier injection by an external temperature due to a structure limitation of the MOSFET, the MOSFET has a subthreshold swing value of 60 mV/dec or higher at room temperature.

To overcome the problems of the typical MOSFET device and reduce the subthreshold swing value to 60 mV/dec or lower, a Tunneling FET and an impact-ionization FET on an SOI (Silicon-on-insulator) has been researched. But, because the transistors are implemented on an SOI substrate, a complicated fabrication process is required, and additional problems due to high operating voltage and low current on/off ratio occur.

Meanwhile, to implement the soft device having various forms, the soft device should be produced by using various forms or nanomaterials such as nanowires, nanoparticles, organic materials, etc., deviating from the typical bulk based device development. Specifically, to implement an energy efficient soft device, the nanowire which has excellent electrical characteristics and may implement soft characteristics is largely preferred in the research field.

SUMMARY OF THE INVENTION

The present invention is provided to solve the described problems, and an object is to provide a semiconductor device and a method of fabricating the same, which can solve the problems of an increase in a leakage current occurring from a short channel effect of a typical MOSFET and a subthreshold swing value of 60 mV/dec or higher due to a structural limitation.

To achieve the object, a semiconductor device according to the present invention includes: an insulation substrate; an intrinsic semiconductor nanowire formed on the insulation substrate and having both ends doped in a p-type and an n-type, respectively, and a region, which is not doped, between the doped region; doped region electrodes formed on each of the p-type doped region and the n-type doped region of the semiconductor nanowire; a lower insulation layer formed on an intrinsic region of the semiconductor nanowire; an intrinsic region electrode formed on a part of the lower insulation layer; and a metal or semiconductor nanoparticle region formed on the lower insulation layer and between the intrinsic region electrode and the doped region electrode and spaced apart from the electrodes.

From the configuration, a transistor device using a nanowire having a source and a drain with a low parasitic resistance and an excellent electrostatic control effect can be provided. In addition, the transistor device using the nanowire of a structure which can have a micro scale size, overcome a short channel effect, and have a low subthreshold swing value can be provided.

In this case, the semiconductor device may further include an upper insulation layer, together with the lower insulation layer, to enclose the metal or semiconductor nanoparticle region. From the configuration, a formed electric charge trap spacer can be protected and a distance from the gate electrode can be more effectively maintained.

In addition, the semiconductor nanowire may be transferred and formed on the substrate. From the configuration, a soft device having various forms can be fabricated.

In addition, the metal or semiconductor nanoparticle of the metal or semiconductor nanoparticle region maybe deposited on the lower insulation layer by sputtering.

Further, the p-type doped region is a drain region doped in $p^+$, and the n-type doped region is a source region doped in $n^+$.

In addition, the lower insulation layer and the upper insulation layer may have high dielectric constants.

Furthermore, a method of fabricating the semiconductor device is also disclosed.

According to the present invention, a transistor device using a nanowire having a source and a drain with a low parasitic resistance and an excellent electrostatic control effect can be provided.

In addition, the transistor device using the nanowire of a structure which can have a micro scale size, overcome a short channel effect, and have a low subthreshold swing value can be provided.

Further, a formed electric charge trap spacer can be protected and a distance from the gate electrode can be more effectively maintained.

In addition, a soft device having various forms can be fabricated.

DETAILED DESCRIPTION OF THE INVENTION

Hereinafter, an exemplary embodiment of the present invention is described with reference to the accompanying drawings.

Figure 1:
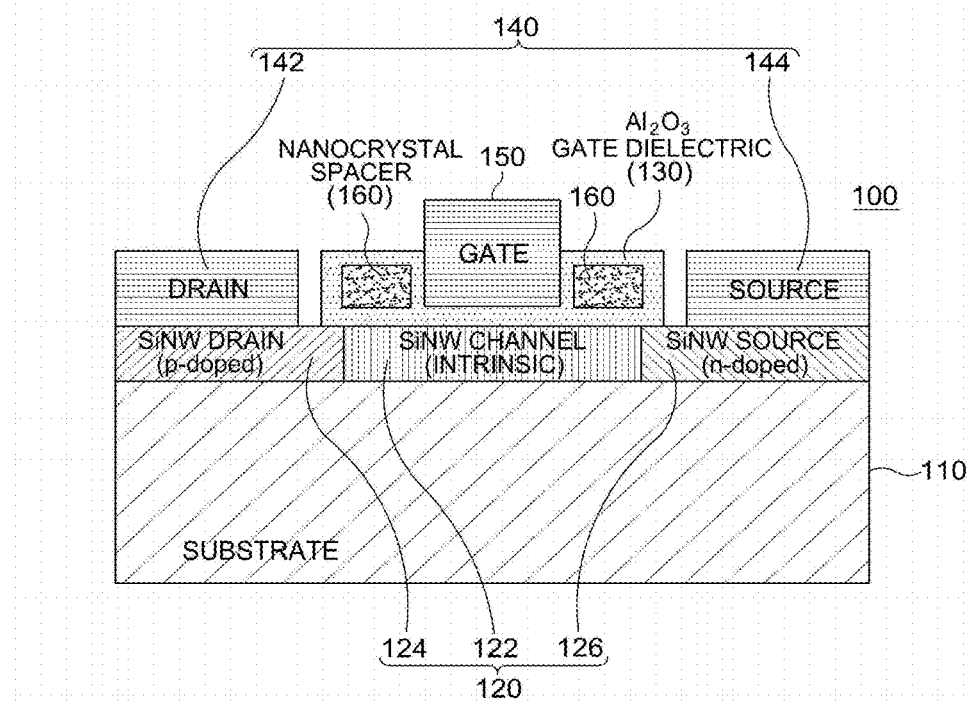
FIG. 1 and FIG. 2 are a cross sectional view and a picture of a semiconductor device fabricated on a plastic substrate by using a single crystal semiconductor nanowire according to an embodiment of the present invention.
Figure 2:
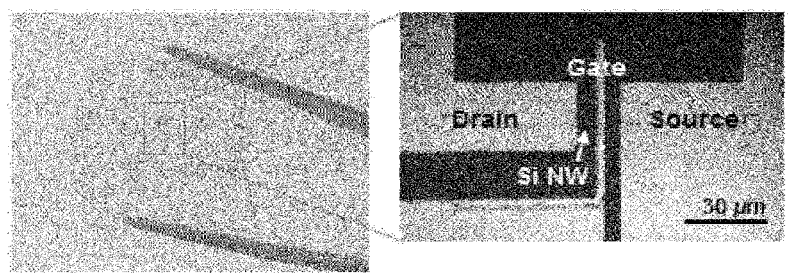

FIG. 1 and FIG. 2 are a cross sectional view and a picture of a semiconductor device fabricated on a plastic substrate by using a single crystal semiconductor nanowire according to an embodiment of the present invention.

A semiconductor device 100 of FIG. 1 includes a soft insulation substrate 110, a $p^+$-i-$n^+$ semiconductor nanowire 120, an insulation layer 130, source/drain metal electrodes 140, a gate electrode structure 150, which covers only a part among an intrinsic channel region and a metal or semiconductor nanoparticle electric charge trap spacer 160.

The semiconductor nanowire 120, which is for a FBFET (Feedback field-effect transistor), has $p^+$, i, $n^+$ impurities injected by using a photolithography and an ion injection process.

The insulation layer 130 is formed to cover each of the channel region 122, respectively, and a metal layer is formed as a gate electrode 150 which is formed on the insulation layer 130 so that the gate electrode 150 corresponds to each channel region, and includes a drain electrode 142 connected to $p^+$ of the semiconductor nanowire for the FBFET and a source electrode 144 connected to $n^+$ of the semiconductor nanowire for the FBFET.

The insulation layer 130 is formed on the semiconductor nanowire 120 from any one material selected among insulation materials ($Al_2O_3$, $HfO_2$, $ZrO_2$). A region where the insulation layer 130 covers the semiconductor nanowire 120 may differ according to a device to be implemented by an electronic device.

The source/drain metal electrode 140 includes the drain electrode 142 forming a $p^+$ drain region 124 and the source electrode 144 forming an $n^+$ source region 126 of the $p^+$-i-$n^+$ semiconductor nanowire 120, in which the regions are formed through a photolithography and then through a sputtering or a thermal deposition scheme.

In addition, the gate metal electrode 150 is electrically connected to the semiconductor nanowire 120 on the insulation layer 130. The gate metal electrode 150 has a width of 2 to 3 um, is formed as the gate electrode 150 by covering a part of the intrinsic channel region 122 of the $p^+$-i-$n^+$ semiconductor nanowire 120 so that the FBFET may be implemented on the insulation layer 130, which covers the semiconductor nanowire 120.

In addition, the metal or semiconductor nanoparticle electric charge trap spacers 160 are positioned at both sides of the gate electrode 150 of the FBFET and spaced apart from each other, and positioned at each part where the gate electrode 150 does not cover the intrinsic channel region 122. The metal or semiconductor nanoparticle electric charge trap spacers 160 may be formed through various schemes, and when using a sputtering scheme selected among various schemes, the spacer may be formed by adjusting a deposition time and a sputtering power. In this case, the metal or semiconductor nanoparticle electric charge trap spacers 160 may be formed by a material selected from metal such as Al, Pt, Ag, etc. and semiconductor materials such as Si, Ge, $Si_3N_4$.

The fabricated nanowire FBFET 100 may be fabricated by various substrates including a flexible substrate, and in the embodiment, the FBFET is fabricated on a transparent plastic substrate so that all parts excluding a metal electrode part are transparent. In addition, the FBFET, which is fabricated by the plastic substrate, may be flexible.

Figure 3:
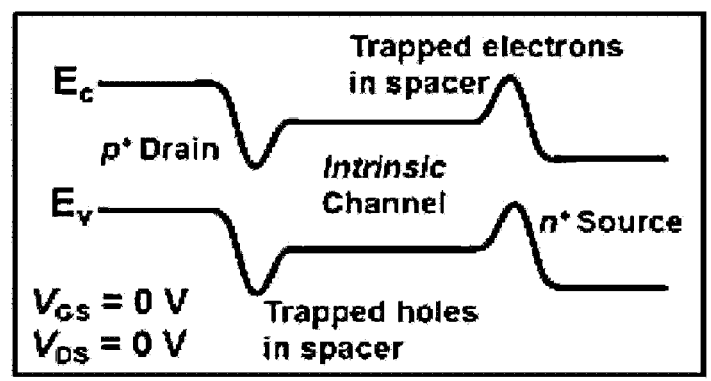
FIG. 3 is an energy band diagram at an off state (gate and drain voltage: 0V) of a FBFET.

FIG. 3 is an energy band diagram at an off state (gate and drain voltage: 0V) of a FBFET.

Generally, a drain current of a forward bias $p^+$-i-$n^+$ diode is determined by a drain voltage level. But, the drain current of the FBFET is adjusted by a gate voltage, and this is due to a potential barrier created inside the channel.

The potential barrier is created by electric charges trapped in the metal or semiconductor nanoparticle electric charge trap spacers, specifically, a positive hole is trapped in the metal or semiconductor nanoparticle electric charge trap spacer making contact with the $p^+$ drain region and an electron is trapped in the metal or semiconductor nanoparticle electric charge trap spacer making contact with the $n^+$ source region to form a potential barrier, which forms the energy band diagram as in FIG. 3.

The process of artificially trapping the positive hole/electron in the metal or semiconductor nanoparticle electric charge trap spacers is called a programming process.

Figure 4:
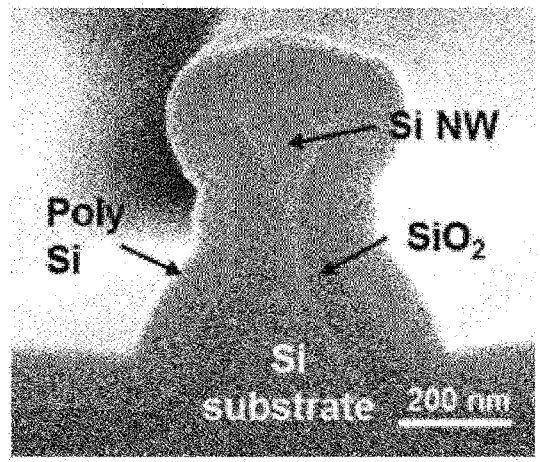
FIG. 4 is an electron microscope photographed picture of a silicon nanowire, which is one of $p^+$-i-$n^+$ semiconductor nanowires required to fabricate the FBFET of FIG. 1, fabricated on a bulk silicon substrate.

FIG. 4 is an electron microscope photographed picture of a silicon nanowire, which is one of $p^+$-i-$n^+$ semiconductor nanowires required to fabricate the FBFET of FIG. 1, fabricated on a bulk silicon substrate.

The $p^+$-i-$n^+$ silicon nanowire in an inverse triangular shape is formed on the bulk silicon substrate through the photolithography, an anisotropic wet etching, a thermal oxidation process, the ion injection process.

As described, Tetramethylammonium Hydroxide is used as an etching solution in the wet etching process. The Tetramethylammonium Hydroxide allows a wet etching ratio with respect to a crystal structure 111 to be slower than a wet etching ratio with respect to a crystal structure 100 or 110 to form a protruding part in a hour glass shape. And then, a second thermal oxidation layer is formed on an entire external surface of the silicon nanowire by thermal oxidizing the multiple silicon nanowires, and an inverted triangle cross section part is the silicon nanowires of a reduced size, and a triangular cross section part is multiple dummy silicon nanowires of a reduced size connected to the base part. In this case, the size of the silicon nanowire may be adjusted according to a thermal oxidation time.

Figure 5:
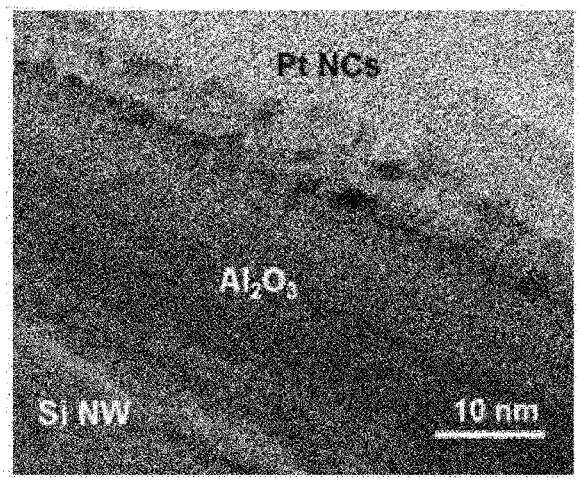
FIG. 5 is a high definition transmission electron microscope picture of a metal nanoparticle electric charge trap spacer, which is one of a metal or semiconductor nanoparticle generated on a region in a channel region of the FBFET where the gate electrode is not covering, that is both side parts of the gate.

FIG. 5 is a high definition transmission electron microscope picture of a metal nanoparticle electric charge trap spacer, which is one of a metal or semiconductor nanoparticle generated on a region in a channel region of the FBFET where the gate electrode is not covering, that is both side parts of the gate.

An average size of the metal or semiconductor nanoparticle is approximately 3 to 5 nm, and each metal or semiconductor nanoparticle is spaced apart from other nanoparticles.

The metal or semiconductor nanoparticle electric charge trap spacer is formed through various methods such as a spin coating, an annealing, the sputtering, etc. When forming the metal or semiconductor nanoparticle electric charge trap spacer using the sputtering, a plasma ion molecular, which is accelerated in a vacuum chamber, collides with a metal or semiconductor target in such a manner that a metal or semiconductor atom to form a nanoparticle breaks loose from the metal or semiconductor target to form a substrate.

The metal or semiconductor atoms formed on the substrate agglomerate with each other, and as a result, the metal or semiconductor nanoparticle is formed. When a sputtering time lasts continuously or a plasma power is high, the metal or semiconductor nanoparticles may agglomerate again to form a metal thin layer. Therefore, when depositing the metal nanoparticles through the sputtering scheme, the plasma power and gas concentration is adequately adjusted to form the nanoparticle.

The formed metal or semiconductor nanoparticle electric charge trap spacer has a more improved electric charge trap characteristic due to a high work function (3 to 5 eV) and being spaced apart from each other.

Figure 6:
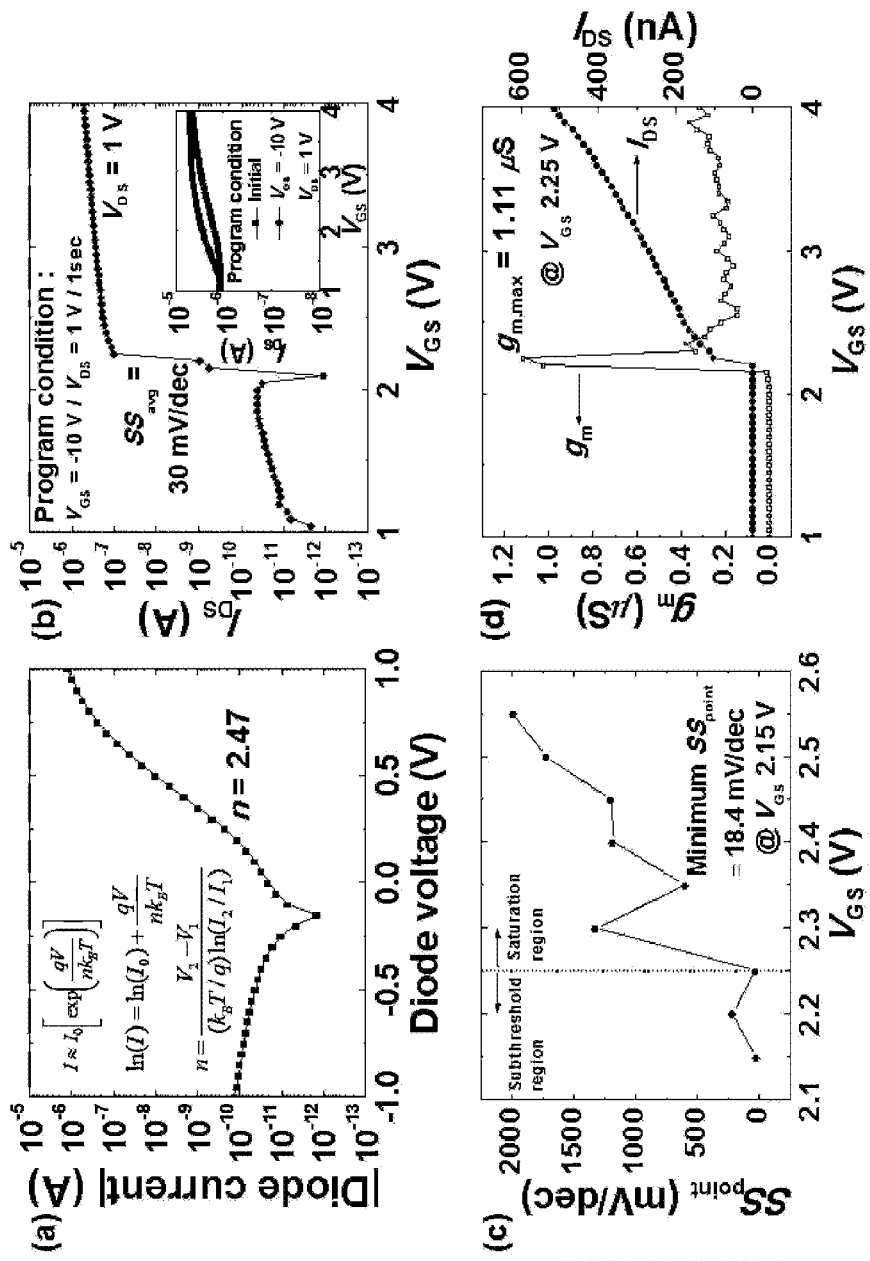
FIG. 6 and FIG. 7 are views illustrating characteristic curves of the fabricated FBFET device.

An electrical characteristic of the produced FBFET is as follows. FIG. 6(a) is a characteristic curve of a diode voltage-diode current measured by fixing a gate voltage of the fabricated FBFET device to 0V.

An ideality factor of the device is calculated as a significantly low value of approximately 2.47, and this illustrates that the $p^+$-i-$n^+$ nanowire has a abrupt junction characteristic. FIG. 6(b) is a characteristic curve of a drain current ($I_{DS}$)—gate voltage ($V_{GS}$) when a drain voltage ($V_{DS}$) is fixed to 1V.

An electrical characteristic curve of FIG. 6(b) is derived after performing a programming condition, in which the gate voltage of 10V and the drain voltage of 1 V are applied for 1 second. After performing the programming condition, the positive hole is trapped in the metal nanoparticle electric charge trap spacer positioned next to a $p^+$ drain, and the electron is trapped in the metal nanoparticle electric charge trap spacer positioned next to an $n^+$ source. According to the electrical characteristic curve of FIG. 6(b), the produced FBFET has a current on/off ration of $10^5$ or higher and a threshold voltage ($V_{TH}$) of 2.25 V, such that the FBFET shows a very rapid switching characteristic. In the case of the characteristic curve of FIG. 6(b), the produced FBFET shows an n-type characteristic, but may show a p-type characteristic according to a programming characteristic and a bias condition of the FBFET.

An average subthreshold swing at a subthreshold region is defined by dividing a difference between the threshold voltage and a gate voltage of a device off state by a log value difference of the drain current at a device off state and at a threshold voltage, and the calculated average subthreshold swing by the definition is 30.2 mV/dec. The calculated average subthreshold swing of the produced FBFET is a significantly lower value than a threshold value of the MOSFET of 60 mV/dec at a room temperature.

To verify the rapid switching characteristic, the switching characteristic was verified by producing a control group electronic device, which is not included in the metal nanoparticle electric charge trap spacer. The graph inserted in FIG. 6(b) is a drain current-gate voltage characteristic curve of the control group electronic device.

The control group electronic device did not show any switching characteristic in an identical programming and measurement condition. This shows that the metal nanoparticle electric charge trap spacer plays a role of implementing the potential barrier in the intrinsic channel region, and plays an important role in the switching characteristic of the FBFET.

FIG. 6(c) illustrates a point subthreshold swing value of the produced FBFET.

The point subthreshold swing value is defined as a ratio of an instantaneous gate voltage variation ratio and instantaneous drain current log value variation ratio, and in the case of the produced FBFET, a very low point subthreshold swing value of minimum 18.4 mV/dec at the gate voltage of 2.15 V is derived.

FIG. 6(d) illustrates a transconductance curve with respect to a gate voltage when a voltage between a drain and a source in the produced FBFET is 1V. The subthreshold swing value and the drain current-gate voltage characteristic curve of the produced FBFET may vary according to the programming condition.

Figure 7:
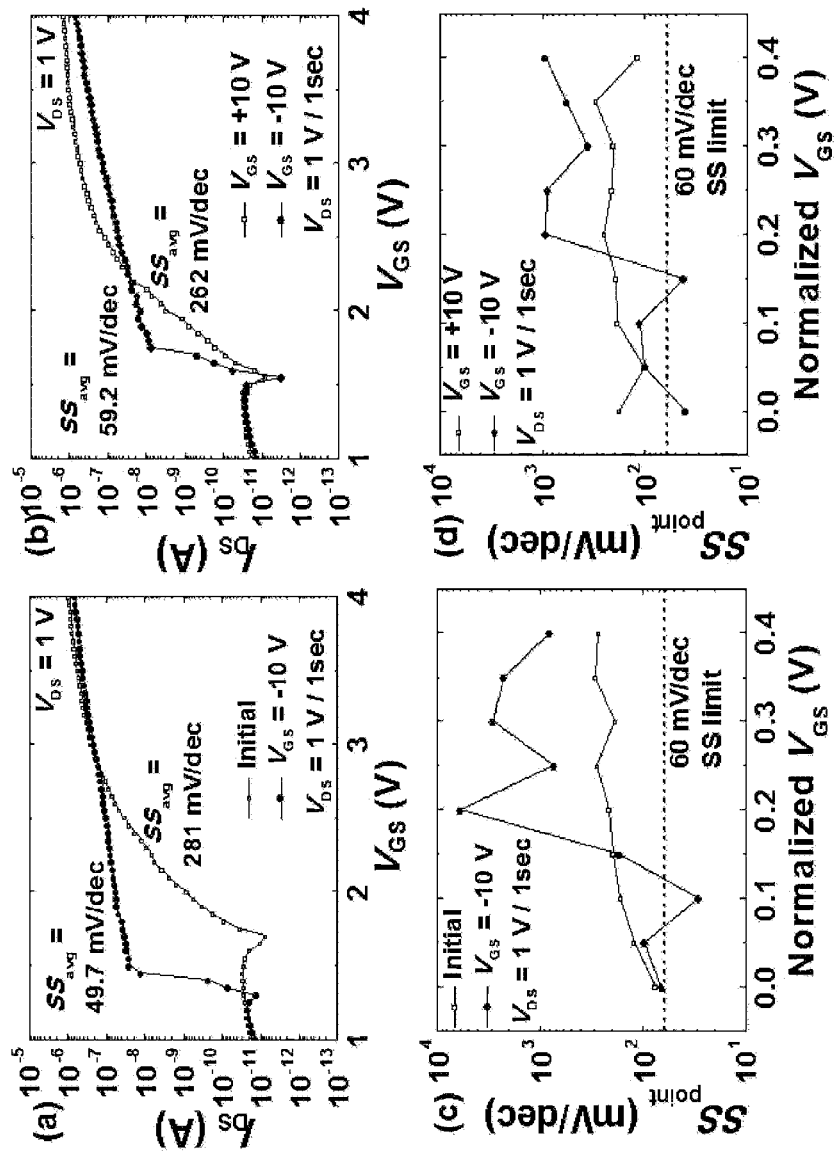

FIGS. 7(a) and (c) are a drain current-gate voltage characteristic curve and a subthreshold swing variation curve after an initializing condition and the programming condition, in which the gate voltage of 10V and drain voltage of 1 V are applied for 1 second, are performed. The initializing condition is defined as no electric charge is trapped in every metal nanoparticle electric charge trap spacer.

In the initializing condition, the drain current-gate voltage curve of the FBFET slowly varying is identified, and shows an average subthreshold swing of 281 mV/dec and a minimum subthreshold swing of 100 mV/dec. But, after the programming condition is applied, the rapid switching characteristic may be identified again when the drain current-gate voltage characteristic is examined, the average subthreshold swing of 49.7 mV/dec and the minimum point subthreshold swing of 28.5 mV/dec may be identified.

In addition, when varied from the initializing condition to the programming condition, the threshold voltage of the produced FBFET varied from 2.95 V to 1.45 V. In addition, the drain current-gate voltage characteristic and the average/point subthreshold swing are compared after taking a programming condition, in which a gate voltage of −10 V and a drain voltage of 1 V are applied for 1 second, and a programming condition, in which gate voltage of +10 V and a drain voltage of 1V for 1 second are applied.

In the drain current-gate voltage characteristic curve, the average subthreshold swing varied from 262 mV/dec to 59.2 mV/dec, the minimum point subthreshold swing varied from 101 mV/dec to 40.1 mV/dec, and the threshold voltage varied from 2.75 V to 1.75 V. The variation of the threshold voltage implies that the produced FBFET may be applied to a memory device such as a flash memory or a nanofloating gate memory device.

Figure 8:
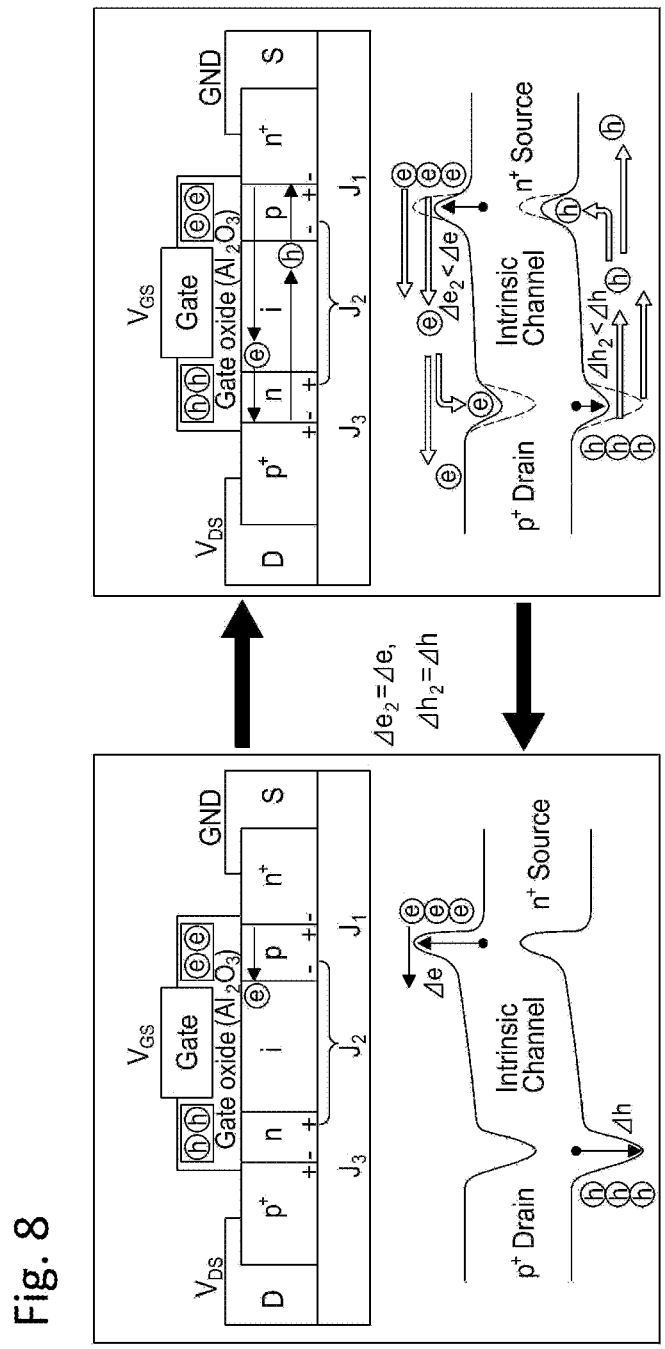
FIG. 8 is a view illustrating an energy band diagram which forms a positive feedback loop of an n-channel FBFET.

The operating principle of a feedback device maybe described by generating a positive feedback loop of the intrinsic channel region. FIG. 8 is a view illustrating an energy band diagram which forms a positive feedback loop of an n-channel FBFET.

The band diagram in the channel of the produced FBFET after the programming has a same structure as $p^+$-n-i-p-$n^+$. In this case, an n-i-p virtual doping inside the channel is created by the electric charge trapped by the metal or semiconductor nanoparticle electric charge trap spacer. Even when a forward bias is applied between the source and the drain of the produced FBFET, the device maintains an off state because a reverse bias in the n-i-p virtual doping inside the FBFET channel is formed. Therefore, a device leakage current of the off state is defined as a reverse junction leakage current of a diode.

In the state, when the gate voltage of the FBFET is increased, a height of the potential barrier positioned at the $n^+$ source is lowered, thus a part of the injected electron flows to the $p^+$ drain, and a part of the electron accumulates in a potential well positioned next to the $p^+$ drain. The accumulated electron again lowers the potential barrier positioned next to the $p^+$ drain, and the positive hole is injected into the $n^+$ source in the $p^+$ drain due to the lowered barrier.

The partially injected positive hole is also accumulated in the potential well positioned next to the n+ source thereby lowering the potential barrier. The continuous lowering of the potential barrier occurs repetitively due to the accumulation of the injected positive holes and electrons, and the lowering of the potential barrier exponentially increases the injection of the positive hole and the electron to create the positive feedback loop in the channel, and as a result, the rapid switching characteristic of the device is implemented.

FIG. 9 to FIG. 14 are views illustrating a method of fabricating a feedback soft electronic device according to an embodiment of the present invention.

1. First, a silicon nanowire, which is a type of a semiconductor nanowire to be used as a channel material, is fabricated through a CMOS-compatible top-down process on a bulk silicon substrate.

The silicon nanowire is fabricated by a method including: sequentially forming a first thermal oxidation layer, a silicon nitride layer and a photoresist pattern on a bulk type single crystal substrate; forming multiple silicon columns, on which support columns are connected to both ends, by dry etching the silicon nitride layer and the first thermal oxidation layer by using the photoresist pattern as a mask and dry etching the silicon substrate by using the dry etched silicon nitride layer as a mask; forming multiple silicon columns, in which an inverse triangle cross section and a triangle cross section are connected at a lower part of the first thermal oxidation layer by wet etching the silicon columns; forming a second thermal oxidation layer by thermal oxidizing the wet etched silicon columns and forming multiple silicon nanowires from the inverse triangle cross section; removing the silicon nitride layer, and selectively injecting impurities into each of the silicon nanowires and thermal treating; and removing the first thermal oxidation layer and the second thermal oxidation layer.

In this case, the step of selectively injecting the impurities includes selecting a type and dose of the impurities injected into the silicon nanowires. In addition, the wet etching is an anisotropic wet etching using tetramethyl ammonium hydroxide (TMAH), and the multiple silicon columns, to which the support columns are connected and in which the inverse triangle cross section and the triangle cross section at a lower part of the first thermal oxidation layer are connected, may be formed by adjusting a time of the anisotropic wet etching.

The $p^+$-i-$n^+$ silicon nanowire is fabricated on the bulk silicon substrate of array 100 having a doping concentration of $10^{16}$ cm$^{-3}$ according to the method of fabricating a silicon nanowire. For fabricating the $p^+$-i-$n^+$ silicon nanowire, the photolithography, the plasma dry etching, the anisotropic wet etching using a TMAH solution, the thermal oxidation process and the ion injection process are included.

In the $p^+$-i-$n^+$ silicon nanowire, which passed through the ion injection process, the $p^+$ drain region and the $n^+$ source region has a doping concentration of $-10^{20}$ cm$^{-3}$, and the intrinsic channel region has a length of 4 to 7 um according to the ion injection process of the p+ drain region and the n+ source region. The type, dose and injection energy of the impurities in the ion injection process may vary according to a type of the electronic device to be implemented.

Figure 9:
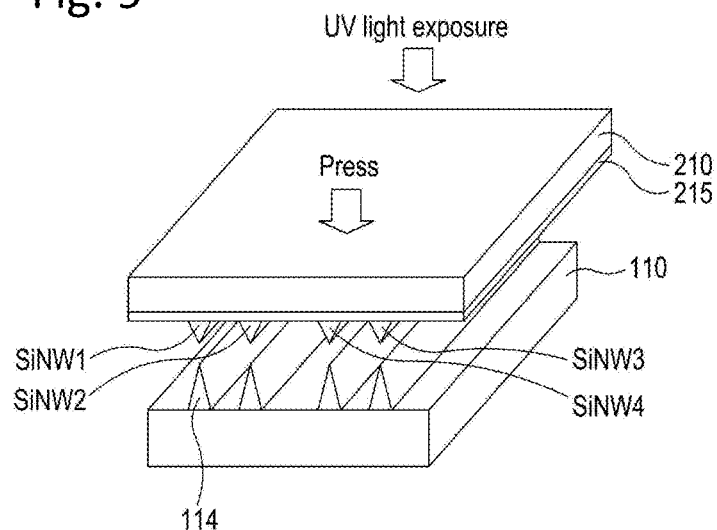
FIG. 9 and FIG. 10 are views illustrating a process of the silicon nanowire, which is used as one of the semiconductor nanowires, transferred on a soft insulation substrate.
Figure 10:
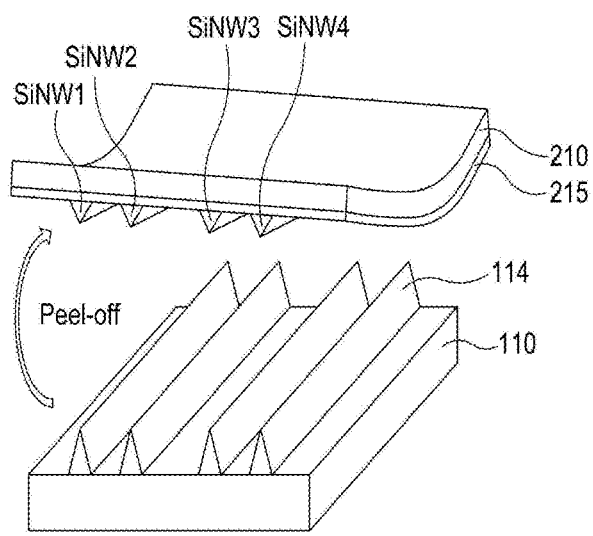

2. The $p^+$-i-$n^+$ semiconductor nanowire including the produced $p^+$-i-$n^+$ silicon nanowire is formed by using a direct transfer method on the insulation substrate. FIG. 9 and FIG. 10 are views illustrating a process of transferring the semiconductor nanowire on a soft insulation substrate. The insulation substrate 130 may be formed by any one selected from not only flexible materials, that is plastic, paper, rubber and fabric but also typical hard substrates or glass.

Figure 11:
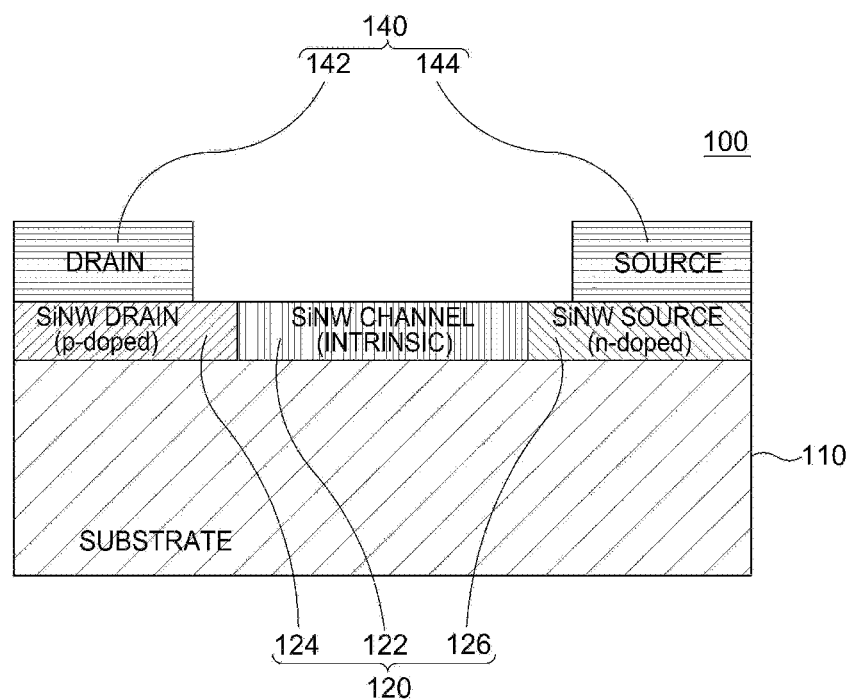
FIG. 11 is a view illustrating a source/drain electrode formed on the silicon nanowire, which is used as one of the semiconductor nanowires.

3. The source/drain electrode 140 are formed on the semiconductor nanowire 120 transferred on the substrate 130. FIG. 11 is a view illustrating a source/drain electrode 140 formed on the semiconductor nanowire 120. The source/drain metal electrode 140 includes the drain electrode 142 forming the p+ drain region 124 and the source electrode 144 forming the n+ source region 126 of the $p^+$-i-$n^+$ semiconductor nanowire 120, and may be formed through the sputtering or thermal deposition scheme after forming a region through the photolithography.

Figure 12:
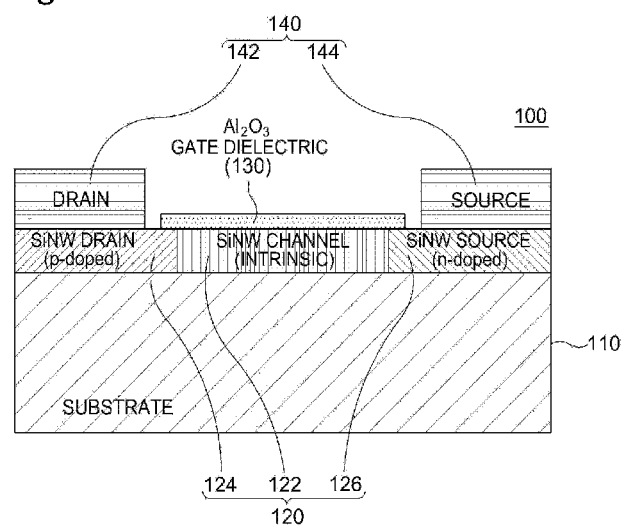
FIG. 12 is a view illustrating a high dielectric constant insulation layer formed on the silicon nanowire part, which is used as one of the semiconductor nanowires.

4. The high dielectric constant insulation layer 130 is formed on the semiconductor nanowire channel part 122. FIG. 12 is a view illustrating a high dielectric constant insulation layer formed on the semiconductor nanowire channel part. The insulation layer 130 is formed from any one material selected from insulation materials (Al$_2$O$_3$, HfO$_2$, ZrO$_2$, etc.) on the semiconductor nanowire 120. The insulation layer 130 may cover a different region of the semiconductor nanowire 120 according to the device which the electronic device is to be implemented.

Figure 13:
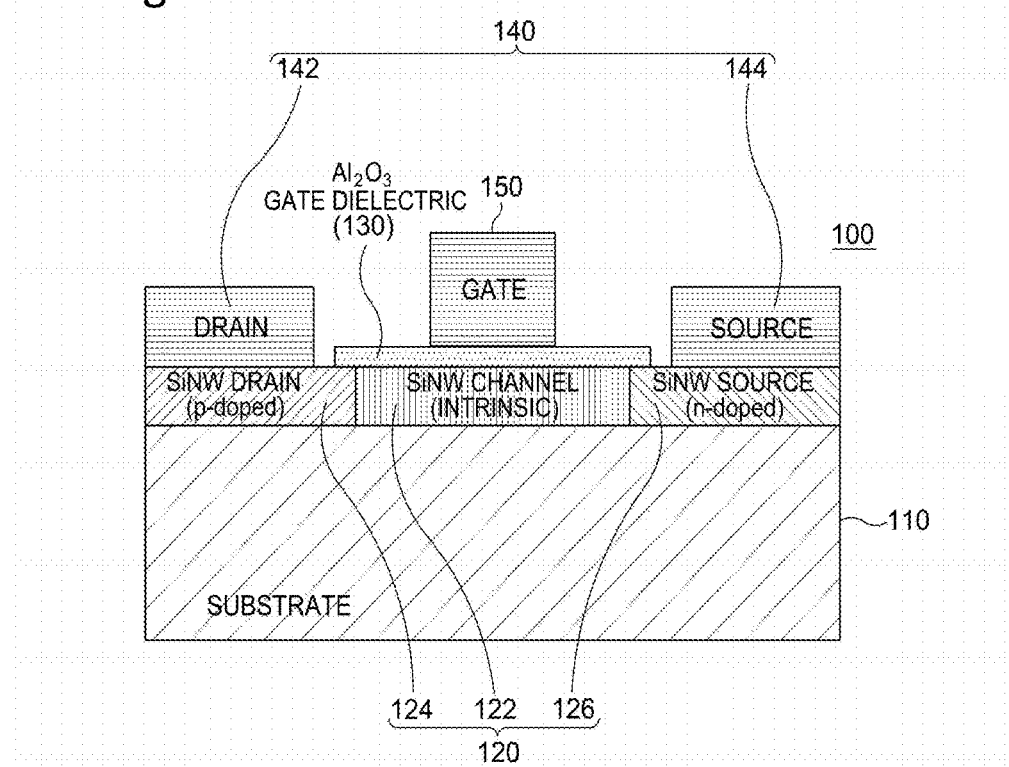
FIG. 13 is a view illustrating a gate electrode formed on the gate on the gate insulation layer.

5. The gate electrode 150 is formed on the semiconductor nanowire channel part 122/gate insulation layer 130. FIG. 13 is a view illustrating a gate electrode formed on the gate insulation layer.

The gate metal electrode 150 is electrically connected to the semiconductor nanowire 120 on the insulation layer 130. The gate metal electrode 150 has a width of 2 to 3 um, and covers a part of the intrinsic channel region 122 of the $p^+$-i-$n^+$ semiconductor nanowire so that the FBFET may be implemented on the insulation layer 150, which covers the semiconductor nanowire 120.

Figure 14:
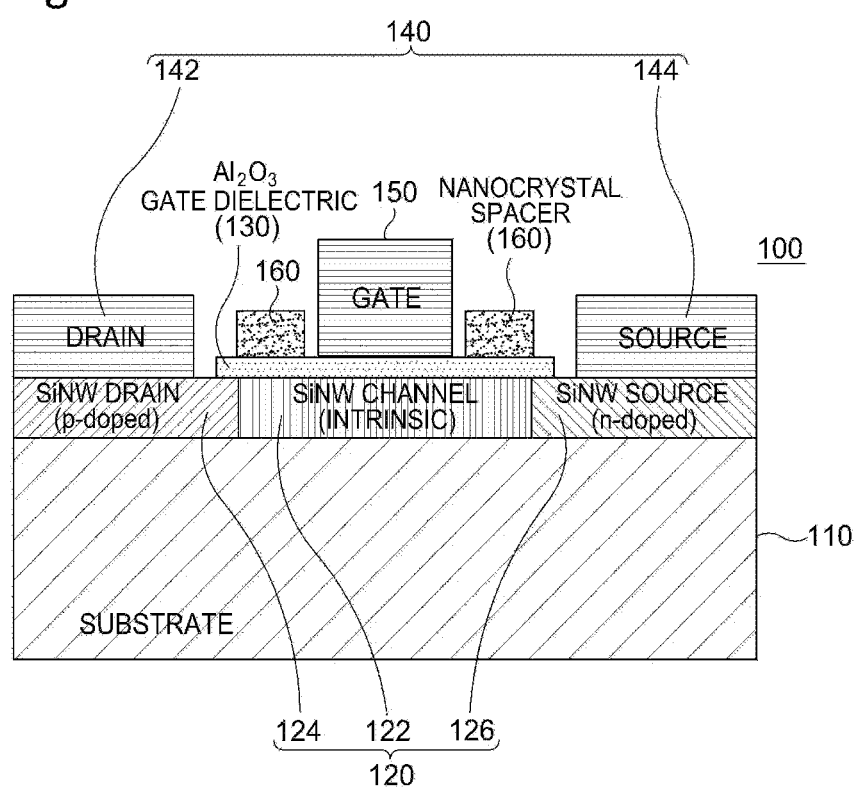
FIG. 14 is a view illustrating the metal or semiconductor nanoparticle electric charge trap spacer formed on the gate insulation layer.

6. The metal or semiconductor nanoparticle electric charge trap spacer 160 is formed. FIG. 14 is a view illustrating a metal or semiconductor nanoparticle electric charge trap spacer formed on the gate insulation layer.

The metal or semiconductor nanoparticle electric charge trap spacers 160 are positioned at both sides of the gate electrode 150 of the FBFET and spaced apart from the gate electrode 150, and are positioned at each part where the gate electrode 150 does not cover on the intrinsic channel region 122 through the photolithography.

The metal or semiconductor nanoparticle electric charge trap spacer 160 may be formed by using various schemes such as the annealing, the spin coating, the sputtering, etc. For example, a platinum nanoparticle electric charge trap spacer is formed using the sputtering by depositing for approximately 8 to 10 seconds at a power of 25 W in an environment of 25 sccm of Ar gas.

7. The high dielectric constant insulation layer 130 is deposited to protect the metal or semiconductor nanoparticle electric charge trap spacer 160 and separate the metal or semiconductor nanoparticle electric charge trap spacer 160 from the gate electrode 150. A method and a material for depositing are identical to the method of forming the gate insulation layer 130. The electric charge trap spacer, in which the high dielectric constant insulation layer 130 is deposited, is illustrated in FIG. 1.

The present invention is provided to solve the problems of the leakage current increasing due to the short channel effect of the MOSFET and having the subthreshold swing value of 60 mV/dec or higher due to a structural limitation, and implement the transistor device, of which the described problems are solved, on the soft substrate such as plastic, paper, leather, etc. to implement various soft devices.

To solve the problems, the present invention provides the Feedback Field Effect Transistor (FBFET) using the single crystal semiconductor nanowire and the metal or semiconductor nanoparticle electric charge trap spacer.

A basic structure of the FBFET includes the gate electrode, and the $p^+$-i-$n^+$ diode including the electric charge trap spacer positioned at both sides of the gate electrode. In the forward bias state, the FBFET can achieve a very low subthreshold swing by the electric charges trapped in the gate spacer.

When sufficient electric charges are stored by the electric charge trap spacer positioned at both sides of the gate, the channel band diagram of the FBFET is formed same as a p-n-p-n diode. The channel band structure is same as a thyristor or a field-effect diode, and the channel band structure can implement not only the rapid subthreshold swing but also the high current on/off ratio and the low operating voltage by generating the positive feedback loop in the channel.

The positive feedback loop of the FBFET may be implemented through an adequate device structure such as a tri-gate structure and an adequate electric charge trap material, which may easily store the electric charge for a long time. Nevertheless, implementing the tri-gate on a typical SOI substrate is difficult due to the difficulty in the process.

Therefore, in the present invention, the nanowire, which may easily implement the tri-gate or the gate-all-around (GAA) structure without requiring a complicated process, is used as the channel material. Furthermore, the nanowire is easily transferred on various flexible substrates such as plastic, etc. through the direct transfer method, and this characteristic is essential to implement the soft device.

An embodiment of the present invention includes a substrate, a single crystal $p^+$-i-$n^+$ nanowire formed on the substrate, a metal or semiconductor nanoparticle electric charge trap spacer, in which a feedback loop is formed due to a potential barrier in an intrinsic channel by a metal or semiconductor nanoparticle so that a rapid switching characteristic and a subthreshold swing value of 60 mV/dec or lower can be implemented through amplification. In addition, in an embodiment of the present invention, the metal or semiconductor nanoparticle such as aluminum, gold, platinum, silicon, germanium, silicon nitride, etc. for the metal or semiconductor nanoparticle electric charge trap spacer material of the FBFET.

According to the method of fabricating a silicon nanowire among the semiconductor nanowire according to an embodiment of the present invention, by easily adjusting a type and concentration of impurity, which is injected into the multiple silicon nanowires by using a photomask, the silicon nanowires for the electronic device maybe easily formed on one bulk type single crystal silicon substrate.

In addition, according to the method of fabricating a metal or semiconductor nanoparticle electric charge trap spacer according to an embodiment of the present invention, by adjusting the type and size of the metal or semiconductor nanoparticle electric charge trap spacer through the sputtering method, the spacer, which may form the potential barrier in the channel, may be easily formed.

In addition, the method of fabricating a silicon nanowire and the FBFET electronic device fabricated by forming the metal or semiconductor nanoparticle electric charge trap spacer according to an embodiment of the present invention, have the average subthreshold swing of at least 30.2 mV/dec, so the switching characteristic may be improved due to this electrical characteristic. Above all, the corresponding device is operated at low power and may implement a multi-function soft electronic device having high performance.

The energy efficient soft device technology provided by the present invention, maybe applied to the soft device by integrating various devices such as an information display device such as a display, an information processing device such as a flexible IC, an information storage device such as a flexible memory, etc., and a sensor. Eventually, the power consumption problem, which typical MOSFET devices have, is solved so that portability is maximized and the performance of the electronic device may be improved from the improvement in the switching characteristic.

The present invention can not only improve disadvantages of typical MOSFET device, which is inserted not only into typical portable devices but also into electronic devices of various forms such as TV, computer, etc., and developing a new form of a soft type electronic device may be realized. Therefore, by the present invention, a MOSFET device maybe replaced in all of the electronic device markets, in which the typical semiconductor device is applied, and the technology may be used to newly develop a highly energy efficient wearable device market.

The present invention overcomes the disadvantage of the typical semiconductor device, and may be a foundation for a new form of soft electronic devices. Therefore, the technology may have value for companies who manufacture semiconductor components. In addition, when applying the highly energy efficient technology based on the present invention, the technology may have value for not only the semiconductor component companies but also for finished goods companies manufacturing electronic device in various forms such as mobile phones, TVs, portable devices, medical devices, wearable smart devices, etc.

While the present invention has been particularly shown and described with reference to various embodiments thereof, it should not be interpreted in any way to limit the scope of the present invention and it will be understood by those of ordinary skill in the art that various substitutions, changes in form and alterations may be made therein without departing from the spirit and the scope of the present invention.

What is claimed is:

1. A semiconductor device comprising:
    an insulation substrate;
    a semiconductor nanowire formed on the insulation substrate and having both end regions doped in a p-type and an n-type, respectively and an intrinsic region, which is not doped, between the p-type doped region and the n-type doped region;

doped region electrodes formed on each of the p-type doped region and the n-type doped region of the semiconductor nanowire;

a lower insulation layer formed on the intrinsic region of the semiconductor nanowire;

an intrinsic region electrode formed on a part of the lower insulation layer; and metal or semiconductor nanoparticle regions formed on the lower insulation layer between the intrinsic region electrode and each of the doped region electrodes and spaced apart from the intrinsic region electrode, wherein the metal or semiconductor nanoparticle regions are positioned at both sides of the intrinsic region electrode, and wherein the metal or semiconductor nanoparticle regions are positioned at parts of the lower insulation which are not covered by the intrinsic region electrode.

2. The semiconductor device according to claim 1, further comprising
an upper insulation layer, together with the lower insulation layer, to enclose the metal or semiconductor nanoparticle regions.

3. The semiconductor device according to claim 2, wherein
the semiconductor nanowire is transferred on the insulation substrate.

4. The semiconductor device according to claim 3, wherein
metal or semiconductor nanoparticles of each of the metal or semiconductor nanoparticle regions are deposited on the lower insulation layer by sputtering.

5. The semiconductor device according to claim 4, wherein
the p-type doped region is a drain region doped in $p^+$, and the n-type doped region is a source region doped in $n^+$.

6. The semiconductor device according to claim 5, wherein
the lower insulation layer and the upper insulation layer have a high dielectric constant.

7. A method of fabricating a semiconductor device comprising:

forming a semiconductor nanowire, which is formed on an insulation substrate and having both end regions doped in a p-type and an n-type, respectively and an intrinsic region, which is not doped, between the p-type doped region and the n-type doped region, on the insulation substrate;

forming doped region electrodes, which are formed on each of the p-type doped region and the n-type doped region of the semiconductor nanowire;

forming a lower insulation layer, which is formed on the intrinsic region of the semiconductor nanowire;

forming an intrinsic region electrode, which is formed on a part of the lower insulation layer; and forming metal or semiconductor nanoparticle regions, which are formed on the lower insulation layer between the intrinsic region electrode and each of the doped region electrodes and spaced apart from the intrinsic region electrode, wherein the metal or semiconductor nanoparticle regions are positioned at both sides of the intrinsic region electrode, and wherein the metal or semiconductor nanoparticle regions are positioned at parts of the lower insulation layer which are not covered by the intrinsic region electrode.

8. The method according to claim 7, further comprising
forming an upper insulation layer, which, together with the lower insulation layer, encloses the metal or semiconductor nanoparticle regions.

9. The method according to claim 8, wherein
the semiconductor nanowire is transferred on the insulation substrate.

10. The method according to claim 9, wherein
metal or semiconductor nanoparticles of each of the metal or semiconductor nanoparticle regions are deposited on the lower insulation layer by sputtering.

11. The method according to claim 10, wherein
the p-type doped region is a drain region doped in $p^+$, and the n-type doped region is a source region doped in $n^+$.

12. The method according to claim 11, wherein
the lower insulation layer and the upper insulation layer have high dielectric constants.

* * * * *